(12) United States Patent
Ma et al.

(10) Patent No.: US 11,223,032 B2
(45) Date of Patent: Jan. 11, 2022

(54) THIN FILM BARRIER STRUCTURE

(71) Applicant: Universal Display Corporation, Ewing, NJ (US)

(72) Inventors: Ruiqing Ma, Morristown, NJ (US); Michael Hack, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 322 days.

(21) Appl. No.: 15/825,493

(22) Filed: Nov. 29, 2017

(65) Prior Publication Data
US 2018/0151843 A1 May 31, 2018

Related U.S. Application Data

(60) Provisional application No. 62/427,233, filed on Nov. 29, 2016.

(51) Int. Cl.
*H01L 51/52* (2006.01)
*H01L 27/32* (2006.01)

(52) U.S. Cl.
CPC ........ *H01L 51/5275* (2013.01); *H01L 27/323* (2013.01); *H01L 51/5215* (2013.01); *H01L 51/5234* (2013.01); *H01L 51/5256* (2013.01); *H01L 51/5281* (2013.01); *H01L 2251/558* (2013.01)

(58) Field of Classification Search
CPC ............. H01L 51/5275; H01L 51/5215; H01L 51/5234; H01L 27/323
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |

(Continued)

FOREIGN PATENT DOCUMENTS

| | | |
|---|---|---|
| WO | WO-2008057394 A1 | 5/2008 |
| WO | WO-2010011390 A2 | 1/2010 |

OTHER PUBLICATIONS

Baldo, "Highly efficient phosphorescent emission from organic electroluminescent devices," Nature, vol. 395, pp. 151-154, 1998.

(Continued)

*Primary Examiner* — Christine A Enad
(74) *Attorney, Agent, or Firm* — Butzel Long

(57) ABSTRACT

OLED device structures are provided that include an OLED, a high index optical layer (HOL), a thin film barrier disposed over the high index optical layer, and a low index optical layer (LOL) disposed over the thin film barrier. It is shown that such devices provide acceptable color emission that is at least comparable to a conventional device, while also exhibiting improved efficiency and luminance.

15 Claims, 6 Drawing Sheets

(56) References Cited

U.S. PATENT DOCUMENTS

| | | | |
|---|---|---|---|
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 2003/0230980 A1 | 12/2003 | Forrest et al. | |
| 2004/0174116 A1 | 9/2004 | Lu et al. | |
| 2007/0211335 A1* | 9/2007 | Ikeda | G02B 5/305 |
| | | | 359/487.05 |
| 2010/0294024 A1* | 11/2010 | Kumar | B82Y 20/00 |
| | | | 73/38 |
| 2014/0061619 A1* | 3/2014 | Zhu | H01L 51/5256 |
| | | | 257/40 |
| 2014/0376235 A1* | 12/2014 | Dai | G02B 3/00 |
| | | | 362/335 |
| 2017/0022963 A1 | 1/2017 | DeBenedictis | |
| 2017/0023724 A1* | 1/2017 | Qin | G02B 6/0053 |
| 2017/0062680 A1* | 3/2017 | Yoo | H01L 33/60 |
| 2017/0199315 A1* | 7/2017 | Yonemoto | B32B 7/04 |
| 2017/0247579 A1* | 8/2017 | Kwak | B32B 27/08 |
| 2017/0315389 A1* | 11/2017 | Chu | G02F 1/1335 |
| 2018/0017721 A1* | 1/2018 | Nagaya | G01J 1/02 |

OTHER PUBLICATIONS

Baldo, "Very high-efficiency green organic light-emitting devices based on electrophosphorescence," Applied Physics Letters, vol. 75, No. 1, pp. 4-6, Jul. 5, 1999.

* cited by examiner

THIN FILM BARRIER STRUCTURE

CROSS-REFERENCE TO RELATED APPLICATIONS

This application is a non-provisional, and claims the priority benefit, of U.S. Provisional Patent Application Ser. No. 62/427,233, filed Nov. 29, 2016, the entire contents of which are incorporated herein by reference.

FIELD

The present invention relates to structures and arrangement for us in devices such as organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device is provided that includes a substrate; an OLED disposed over the substrate and comprising a first emissive layer configured to emit light of a first color; a high index optical layer (HOL) having a refractive index of not less than 1.7 disposed over the OLED; a thin film barrier disposed over the high index optical layer; and a low index optical layer (LOL) having a refractive index of not more than 1.6 disposed over the thin film barrier. The LOL may include an optically clear adhesive layer, such as a pressure sensitive adhesive or other glue layer.

The thin film barrier may include multiple layers. For example, it may include two layers having refractive indices n1 and n2, where |n1−n2|≤0.2, 0.15, or 0.10. Similarly, the refractive index between any two regions of the thin film barrier may be not more than 0.25. The thin film barrier may have a refractive index of not more than 1.5, or not more than 1.46. The HOL may have a refractive index of not less than 1.8, the LOL may have a refractive index of not more than 1.53, and/or the LOL may have a thickness of about one quarter of a wavelength of the first color, according to the 1931 CIE chart.

According to an embodiment, various other layers may be disposed between the LOL and the HOL. For example, a touch sensor layer, a polarizer layer, or combinations thereof may be included in the device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
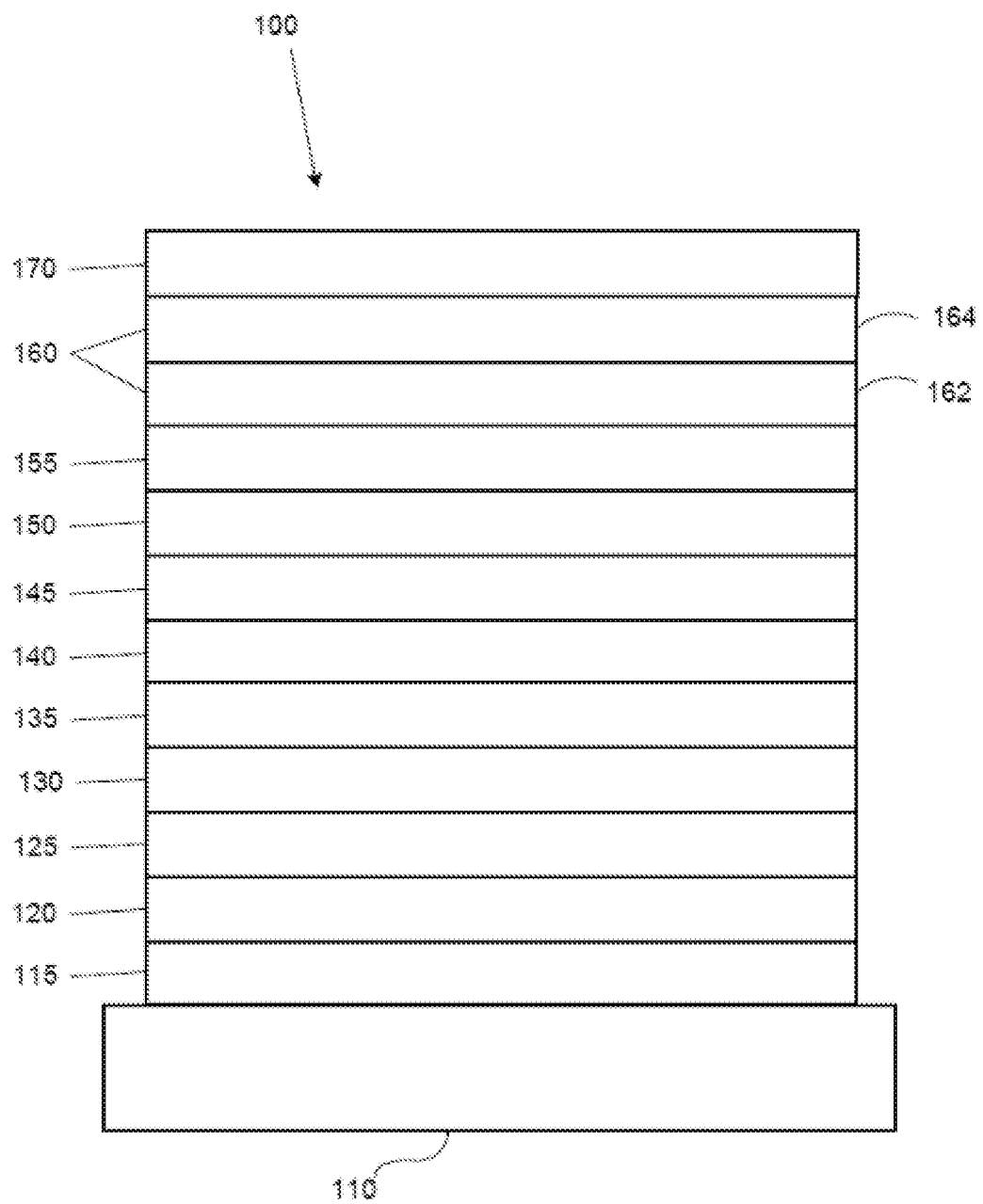
FIG. 1 shows an organic light emitting device suitable for use with embodiments disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
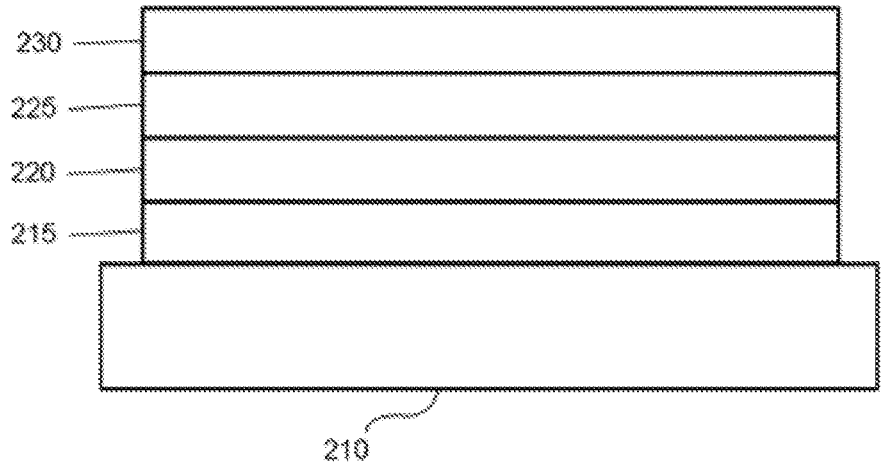
FIG. 2 shows an inverted organic light emitting device that does not have a separate electron transport layer suitable for use with embodiments disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 6A:
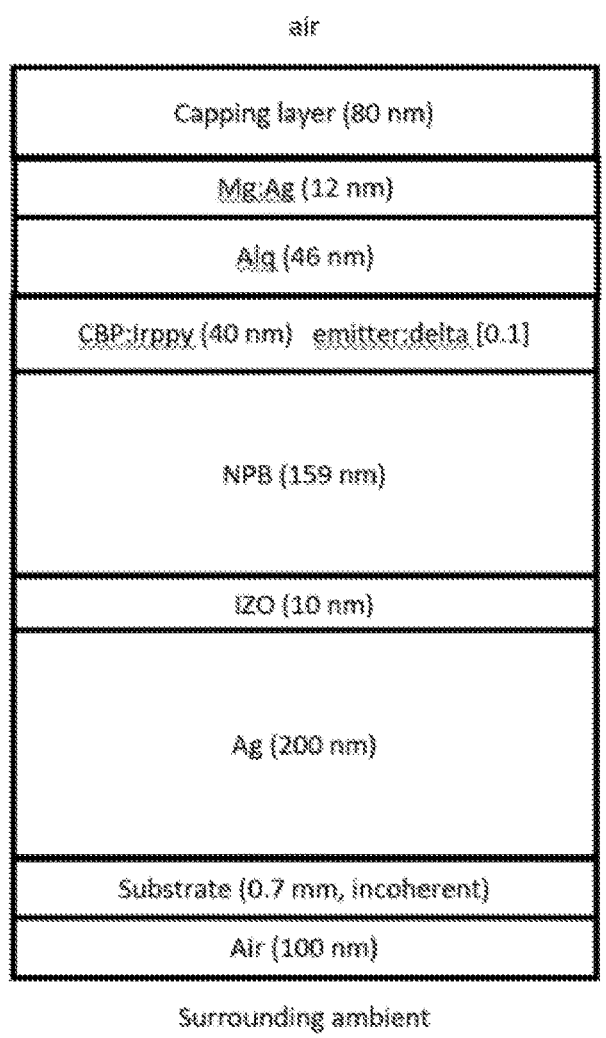
FIG. 6A shows a conventional top emitting OLED (TE-OLED) device structure.

For rigid (non-flexible) OLED devices, typically a glass cover is placed on top of the device for encapsulation to prevent moisture and oxygen from damaging the OLED device. Because the cover glass is not directly in contact with the OLED, such devices typically include a region that is filled with an inert gas such as nitrogen. For top emitting OLEDs, this means the light will emit directly into this space, which has a refractive index of about 1.0. Because all layers in the device are thin layers with strong interference effects, a top optical layer often may be added to optimize the light output. A typical conventional top emitting OLED (TEOLED) device structure is shown in FIG. 6A, with all the layer thickness and material name provided. In this example, the HTL, ETL and EML layers are NPB, Alq and CBP doped with Irppy (green emitter), respectively. The bottom electrode is reflective and the top electrode (Mg:Ag) is semi-transparent.

Figure 6B:
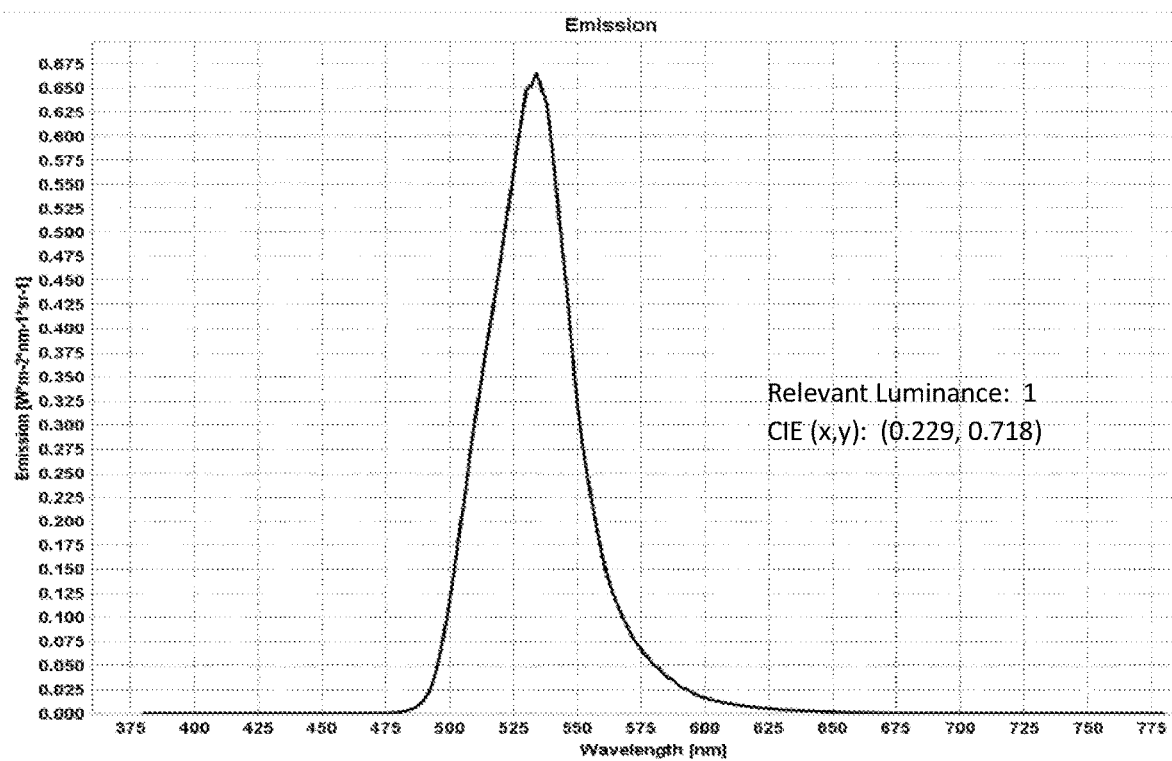
FIG. 6B shows an example simulated emission spectrum for a device as shown in FIG. 6A.

The structure shown in FIG. 6A was simulated with Setfos 4.3 semiconductor thin film optics simulation software by FLUXiM. With relative optimization of all layers, a TOLED is designed with high luminance (normalized to 1) and good color with CIE coordinates of (0.229,0.718) and full width at half maximum (FWHM) of 38 nm, as shown in FIG. 6B. A cover glass is not included in this modeling.

In the present description, this device is taken as a baseline output that can be achieved from a conventional TOLED device. The color coordinate is chosen to be relatively close to the Adobe RGB color coordinate for green (0.21, 0.71). To achieve a comparable device, it may be desirable to maintain a CIE y coordinate of at least 0.71.

Although the present disclosure uses a green device as an example, any and all color devices, including those used in a full color display, may be used without departing from the scope or spirit of the invention, using the same or corresponding techniques, arrangements, components, and devices as disclosed herein. In addition, the structure can be applied to both "RGB side by side" and "white plus color filter" configurations, as well as both top-emission and bottom-emission OLEDs.

When thin film barriers are used to encapsulate OLED devices, a multi-micron barrier film is placed directly on top of OLEDs. Because this layer provides protection for the device, other functional layers may be directly attached and/or optically coupled to the thin film barrier and OLED. For example, functional films may be laminated to the device glue. Examples of such functional films include touch sensor layers, polarizer layers, protective layers, and the like. Functional films may themselves have multiple layers. For example, a linear polarizer film typically includes 2 TAC and 1 PVA films. Functional film components typically are optically coupled to the OLED and barrier system with the help of optical clear adhesive (OCA), such as a pressure sensitive adhesive (PSA).

The layers above the thin film barrier typically have thicknesses of at least 10 μm. Since the coherent length of the OLED source is typically less than 10 μm, the interference between these additional layers above the thin film barrier is not strong. Accordingly, the optical design of the thin film barrier may be simplified, by considering only the layer with the lowest refractive index. These layers typically include plastic films (PET, PC, PS, PEN, TAC, PVA, PMMA and the like) and the adhesive layer(s). Plastic films typically have refractive indices ranging from 1.46 to 1.6. An adhesive layer typically tends to have the lowest refractive index. For example, Adhesives Research indicates that optically clear adhesives typically have indices of about 1.41 to 1.51, as noted in "ARclear Optically Clear Adhesives", available at http://www.adhesivesresearch.com/arclear-optically-clear-adhesives. In the simulations described herein, an average value of 1.46 is used.

According to embodiments disclosed herein, it has been found that a device having acceptable luminance and color properties may be obtained by placing a structure above an OLED that includes a thin film barrier, such as a hybrid barrier or single-layer barrier, disposed between a low index optical layer and a high index optical layer. As described and shown in further detail herein, such arrangements may provide for consistent color comparable to a conventional device, while achieving improved luminance and efficiency compared to a conventional device that does not have the stacked structures disclosed herein.

Figure 3A:
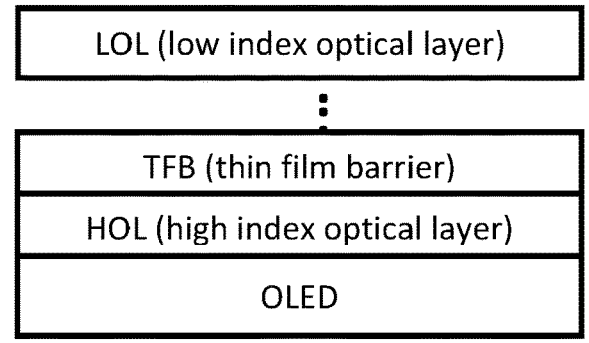
FIG. 3A shows a schematic view of a simulated configuration according to an embodiment, including an OLED device; a high index optical layer; a thin film barrier; and a low index optical layer.

FIG. 3A shows a schematic view of a simulated configuration, including four primary components: 1) an OLED device; 2) a high index optical layer (HOL); 3) a thin film barrier (TFB) directly over and in direct physical contact with the HOL layer; and 4) a low index optical layer (LOL). The LOL is not necessarily in direct physical contact with the TFB layer, and may be optically coupled to the TFB layer through other intervening layers. Typically, such layers may include a touch sensor and a polarizer stack.

Figure 3B:
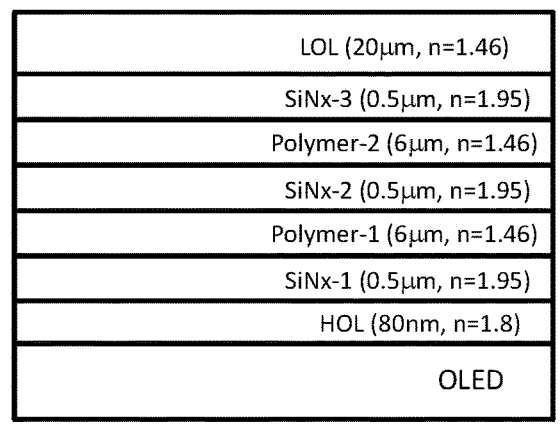
FIG. 3B shows a simulated configuration with a multilayer TFB according to an embodiment.

FIG. 3B shows a simulated configuration with a multi-layer TFB. The LOL is represented by a 20 μm PSA layer, which is set to be incoherent within the simulation. Although 20 μm is used in this example, the LOL may be 15 μm, 10 μm, 5 μm or less. Generally the lower limit of the LOL is comparable to the wavelength of the emitted light. For example, the LOL may be no more than one quarter of the wavelength of the light emitted by the OLED. When the layer is thinner than that, the refractive index number will no longer be accurate. A multi-layer TFB typically includes at least two different materials: a first material, material-1, generally is a dense material that provides the barrier properties of the TFB, and a second material, material-2, typically is a polymer material that provides planarization.

In the simulation disclosed herein, the multi-layer barrier structure is 0.5 μm SiNx/(6 μm Polymer/0.5 μm SiNx)×2, with the indices of SiNx and polymer set as 1.95, and 1.46, respectively. Although this example uses a polymer thickness of 6 μm, such a polymer layer may have a thickness in a much wider range, such as 1 μm to 20 μm.

Comparing to the rigid device as previously disclosed, OLEDs with TFB will have different optical properties, especially in color. An optimization of HTL and ETL thicknesses was performed to identify the device structure with color closest to the sample color coordinate. The simulation result is summarized in Table 1. Keeping the criteria of CIE y≥0.71, a preferred design is with ETL=44 nm, HTL=151 nm, resulting in an output of 73.9% relative to the glass baseline and a color of (0.201, 0.710). An even thinner ETL provides even higher CIE y value. However, the CIE x value deviates from the desired 0.21 value and the luminance of the device decreases.

TABLE 1

Optimization of TEOLED device structure with multi-layer barrier

| ETL (nm) | HTL 151 nm | | HTL 152 nm | | HTL 153 nm | | HTL 155 nm | |
|---|---|---|---|---|---|---|---|---|
| 43 | 0.734 | (0.198, 0.710) | 0.739 | (0.203, 0.709) | 0.742 | (0.209, 0.708) | 0.746 | (0.220, 0.704) |
| 44 | 0.739 | (0.201, 0.710) | 0.743 | (0.207, 0.708) | 0.746 | (0.212, 0.707) | 0.748 | (0.224, 0.703) |
| 45 | 0.744 | (0.205, 0.709) | 0.747 | (0.211, 0.707) | 0.749 | (0.216, 0.705) | 0.749 | (0.228, 0.701) |
| 46 | 0.747 | (0.209, 0.708) | 0.750 | (0.214, 0.706) | 0.751 | (0.220, 0.704) | 0.749 | (0.232, 0.699) |
| 47 | 0.750 | (0.213, 0.707) | 0.751 | (0.218, 0.705) | 0.752 | (0.224, 0.702) | 0.748 | (0.236, 0.697) |
| 48 | 0.751 | (0.216, 0.705) | 0.752 | (0.222, 0.703) | 0.751 | (0.228, 0.701) | 0.746 | (0.241, 0.695) |

Figure 3C:
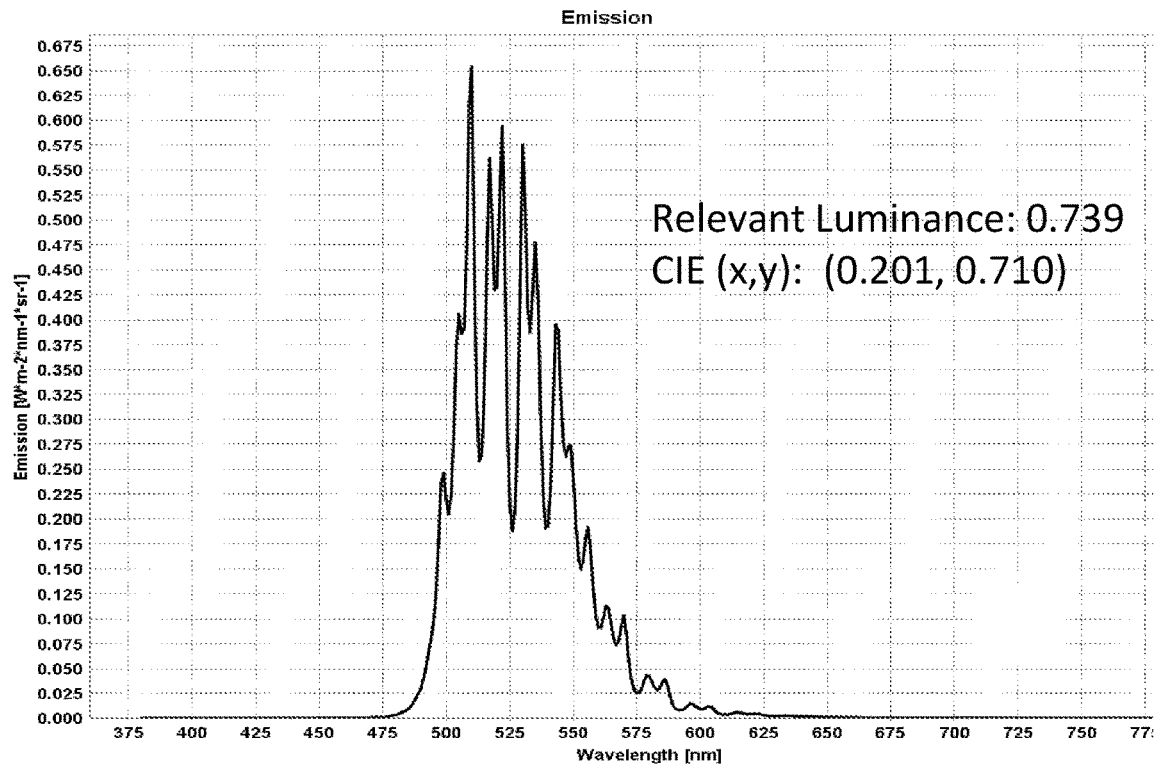
FIG. 3C shows a spectrum curve exhibiting interference effects according to an embodiment.
Figure 3D:
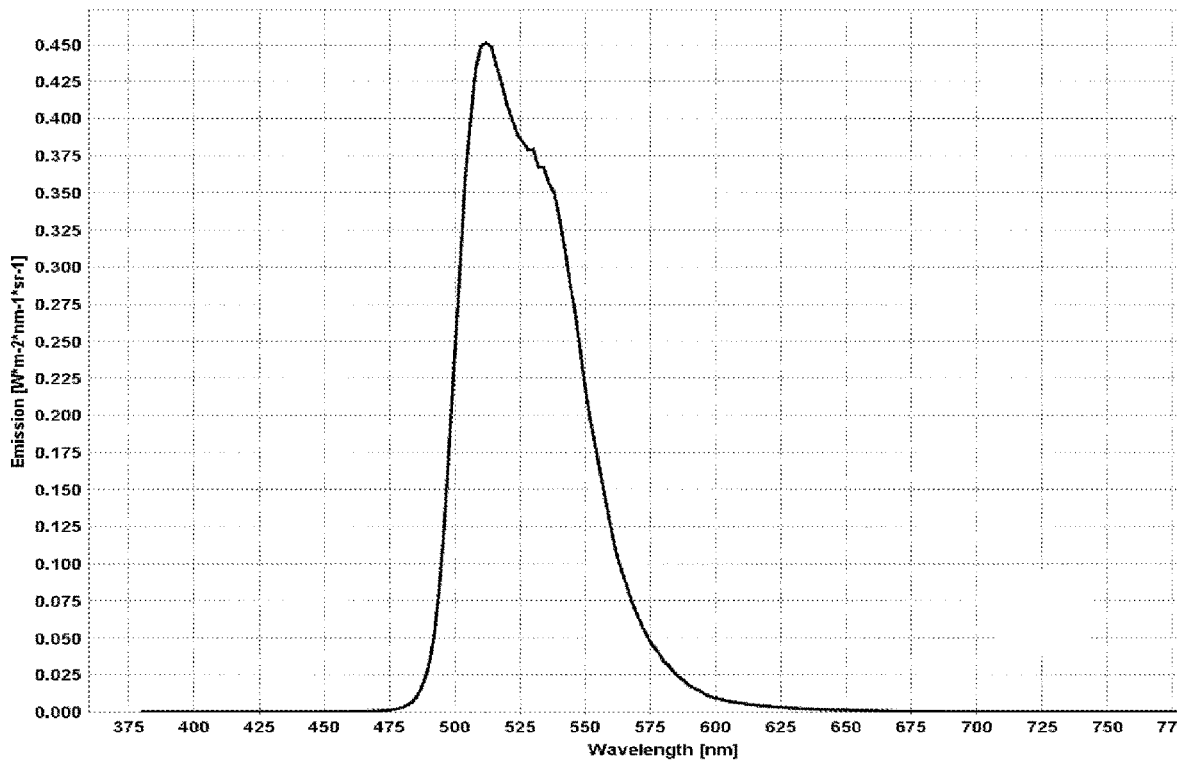
FIG. 3D shows a spectrum curve for a device in which polymer layers are incoherent according to an embodiment.

Within a multi-layer barrier, the refractive indices of SiNx and the polymer may be very different, for example having a difference of 0.49 or more. As a result, relatively strong interference effects may be observed between multiple interfaces of these, as shown in the spectrum curve in FIG. 3C. When the polymer layers are treated as incoherent layers, the spectrum curve becomes smoother, but still has a relatively wider FWHM of 51 nm, as shown in FIG. 3D. Such a wide spectrum may make it difficult to achieve a desired color. In principle, it is possible to optimize the layers for a specific wavelength to minimize the interference effect. However, such a technique may not be suitable for full color display because a common TFB layer may be shared among all colors. Even within a single-color OLED device, it may be difficult to optimize for a desired color because the emission spectrum is not a narrow line. In addition, optimizing for strong interference with multiple interfaces requires extremely precise control of thickness. which may not be practical. Finally, optimization techniques may not work for all viewing angles. Accordingly, a multi-layer TFB with a large index difference may pose a significant challenge in achieving an acceptable color and luminance level.

In this case, it may be beneficial to consider the optical impact of a uniform low index barrier, for example with an index of refraction of about 1.46. The barrier material may be, for example, $SiO_2$, or a hybrid barrier such as the barrier disclosed in U.S. Pat. No. 8,436,533, the disclosure of which is incorporated by reference in its entirety.

Figure 4A:
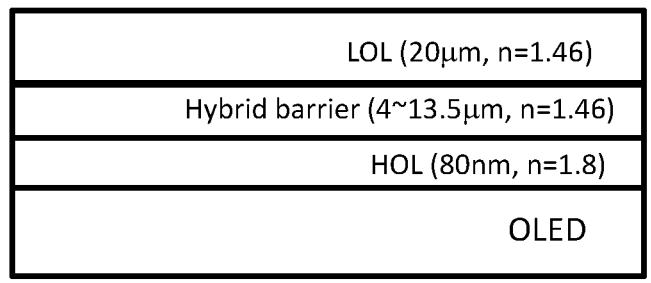
FIG. 4A shows a configuration of a simulated device according to an embodiment.
Figure 4B:
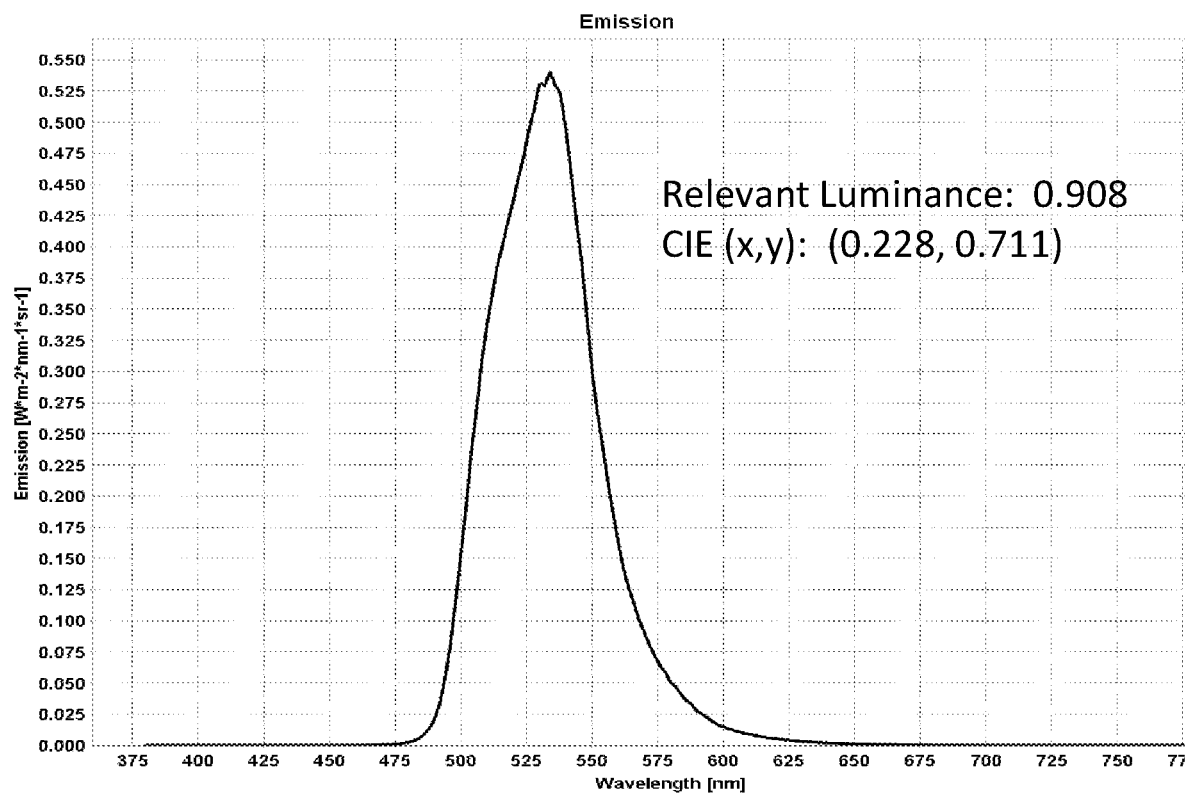
FIG. 4B shows a simulated emission spectrum according to an embodiment.

FIG. 4A shows the simulation configuration of such a device, and FIG. 4B shows the associated emission spectrum. The thickness was varied from 4 μm to 13.5 μm and no difference was observed in the result. An optimization similar to that described with respect to Table 1 was performed by optimizing the HTL/ETL thickness. The result shows a wide range of HTL/ETL thickness combinations that have acceptable color coordinates, as shown in Table 2. In many cases, a luminance level of 90% or more with good color may be achieved. One preferred design from Table 2 may be with ETL=51 nm, HTL=152 nm, resulting in an output of 90.8% relative to the glass baseline and a color of (0.228, 0.711). Notably, the luminance achieved is much higher than in the multi-layer case (0.74) disclosed above, representing a 23% increase. The spectrum is narrower (FWHM-45 nm) than that of the multi-layer TFB device, as shown in FIG. 4B. This result demonstrates that an optically-uniform low index barrier is superior to the multi-layer barrier with a large index difference.

TABLE 2

Optimization of TEOLED device structure with uniform low index (1.46) barrier.

| ETL (nm) | HTL 151 nm | | HTL 152 nm | | HTL 153 nm | | HTL 155 nm | |
|---|---|---|---|---|---|---|---|---|
| 45 | 0.872 | (0.197, 0.721) | 0.881 | (0.202, 0.720) | 0.888 | (0.208, 0.719) | 0.896 | (0220, 0.715) |
| 46 | 0.881 | (0.201, 0.721) | 0.888 | (0.207, 0.719) | 0.894 | (0.212, 0.717) | 0.901 | (0.225, 0.713) |
| 47 | 0.889 | (0.205, 0.720) | 0.895 | (0.211, 0.718) | 0.900 | (0.217, 0.716) | 0.904 | (0.229, 0.711) |
| 48 | 0.895 | (0.209, 0.719) | 0.900 | (0.215, 0.717) | 0.904 | (0.221, 0.714) | 0.906 | (0.234, 0.709) |
| 49 | 0.900 | (0.213, 0.717) | 0.904 | (0.219, 0.715) | 0.907 | (0.226, 0.712) | 0.906 | (0.238, 0.706) |
| 50 | 0.904 | (0.218, 0.716) | 0.907 | (0.224, 0.713) | 0.908 | (0.230, 0.710) | 0.905 | (0.243, 0.704) |
| 51 | 0.906 | (0.222, 0.714) | 0.908 | (0.228, 0.711) | 0.908 | (0.235, 0.708) | 0.903 | (0.247, 0.701) |
| 52 | 0.908 | (0.227, 0.712) | 0.908 | (0.233, 0.709) | 0.907 | (0.239, 0.706) | 0.900 | (0.252, 0.698) |

Figure 5:
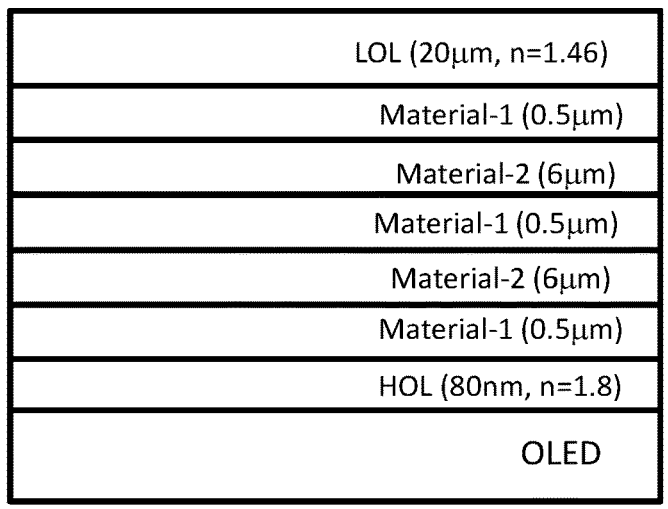
FIG. 5 shows a structure of a generalized two-component multi-layer barrier according to an embodiment.

A generic two-component multi-layer barrier may be generalized with the structure shown in FIG. 5 and optimized similarly to the previous examples. In a typical scenario, material-1 is a dense barrier material and material-2 is a polymer material, as previously described with respect to the results shown in Table 1. In another scenario, material-1 and material-2 may be the same material, as previously disclosed with respect to the results shown in Table 2. In other arrangements, material-1 and material-2 may be based on the same host material doped with different materials, the same host and dopant materials in different ratios, or combinations thereof.

A structure was simulated having HTL/ETL thicknesses of 152 nm and 47 nm, respectively, and an 80 nm HOL layer with an index of refraction of 1.8. Using a uniform low index TFB as previously disclosed, the relative luminance and color coordinate were found to be 0.895 and (0.211, 0.718), respectively. A high CIE y was chosen to allow for fine-tuning. In the optimization work, the relative luminance and color coordinate were simulated for different combinations of the refractive indices of material-1 and material-2. The result is shown in Table 3.

TABLE 3

Optimization of 2-component TFB structure based on refractive indices:
HTL/ETL = 152 nm/47 nm.

| Material-1 | Material-2 n = 1.35 | | Material-2 n = 1.46 | | Material-2 n = 1.5 | | Material-2 n = 1.55 | |
|---|---|---|---|---|---|---|---|---|
| 1.46 | 0.894 | (0.209, 0.716) | 0.895 | (0.211, 0.718) | 0.894 | (0.211, 0.718) | 0.891 | (0.211, 0.719) |
| 1.5 | 0.894 | (0.209, 0.717) | 0.892 | (0.212, 0.717) | 0.890 | (0.212, 0.717) | 0.886 | (0.213, 0.717) |
| 1.6 | 0.894 | (0.213, 0.720) | 0.887 | (0.215, 0.717) | 0.884 | (0.215, 0.716) | 0.880 | (0.216, 0.715) |
| 1.7 | 0.850 | (0.223, 0.717) | 0.858 | (0.222, 0.715) | 0.860 | (0.222, 0.715) | 0.861 | (0.221, 0.714) |
| 1.75 | 0.808 | (0.228, 0.712) | 0.827 | (0.226, 0.712) | 0.833 | (0.225, 0.712) | 0.839 | (0.224, 0.712) |
| 1.8 | 0.762 | (0.230, 0.706) | 0.792 | (0.228, 0.708) | 0.801 | (0.227, 0.708) | 0.811 | (0.227, 0.709) |
| 1.9 | 0.712 | (0.221, 0.700) | 0.747 | (0.224, 0.703) | 0.758 | (0.224, 0.703) | 0.771 | (0.225, 0.704) |
| 1.95 | 0.723 | (0.214, 0.704) | 0.751 | (0.218, 0.705) | 0.761 | (0.220, 0.705) | 0.772 | (0.221, 0.705) |

| Material-1 | Material-2 n = 1.6 | | Material-2 n = 1.7 | | Material-2 n = 1.8 | |
|---|---|---|---|---|---|---|
| 1.46 | 0.888 | (0.212, 0.720) | 0.877 | (0.212, 0.721) | 0.864 | (0.212, 0.722) |
| 1.5 | 0.882 | (0.213, 0.717) | 0.871 | (0.214, 0.718) | 0.858 | (0.215, 0.718) |
| 1.6 | 0.875 | (0.216, 0.715) | 0.864 | (0.217, 0.713) | 0.852 | (0.218, 0.712) |
| 1.7 | 0.861 | (0.221, 0.714) | 0.860 | (0.220, 0.713) | 0.857 | (0.219, 0.712) |
| 1.75 | 0.844 | (0.224, 0.712) | 0.851 | (0.222, 0.712) | 0.854 | (0.221, 0.712) |
| 1.8 | 0.821 | (0.226, 0.709) | 0.835 | (0.225, 0.710) | 0.845 | (0.223, 0.711) |
| 1.9 | 0.783 | (0.225, 0.705) | 0.803 | (0.226, 0.706) | 0.819 | (0.226, 0.708) |
| 1.95 | 0.781 | (0.222, 0.705) | 0.798 | (0.224, 0.706) | 0.810 | (0.226, 0.707) |

One or more criteria may be selected to define a good device performance. In this example, the following were selected as defining acceptable device performance: 1) relative luminance is within 5% of maximum of all the data in the table, i.e., the highest observed achievable luminance range; and 2) CIEy is 0.710 or higher to achieve the desired color. In Table 3, all the data meeting the above criteria are shown in bold. When the index $n_1$ of material-1 is 1.7 or less, and not more than 0.24 higher than the index of the LOL, all the combinations in the table ($n_1 \leq 1.7; 1.35 \leq n_2 \leq 1.8$; $|n_1-n_2| \leq 0.35$) meet the criteria. When the indices of both materials ($n_1$ and $n_2$) are 1.6 or less ($n_1 \leq 1.6$; $1.35 \leq n_2 \leq 1.6$; $|n_1-n_2| \leq 0.25$), the relative luminance is within 2.5% of maximum for all combinations.

The device structure used above (HTL/ETL=152 nm/47 nm) favors low index barrier material-1. To better design a TFB with high index material-1, a different structure was used in which HTL/ETL=151 nm/44 nm. The results are shown in Table 4. All the combinations meeting the same two criteria are highlighted in bold. These can be categorized based on $n_1$ value:

$n_1$=1.75: $1.46 \leq n_2 \leq 1.9$; $|n_1-n_2| \leq 0.29$ $n_1$=1.8: $1.55 \leq n_2 \leq 1.9$; $|n_1-n_2| \leq 0.25$ $n_1$=1.9: $1.65 \leq n_2 \leq 1.9$; $|n_1-n_2| \leq 0.25$ $n_1$=1.95: $1.65 \leq n_2 \leq 1.9$; $|n_1-n_2| \leq 0.3$ When the index of material-1 is higher than 1.7, especially higher than 1.75, it was found that the device showed better performance when the indices of both materials were relatively close to each other, with the maximum luminance typically being achieved when $n_1 \sim n_2$. When $|n_1-n_2| \leq 0.25$, the luminance was found to be within 5% of maximum for all combinations with the same $n_1$. Better color performance was also observed when $n_1$ was close to $n_2$, as shown in Table 4, with improved performance being observed when $|n_1-n_2| \leq 0.2$, 0.15, or 0.1.

TABLE 4

Optimization of 2-component TFB structure based on refractive indices: HTL/ETL = 151 nm/44 nm.

| Material-1 | Material-2 n = 1.46 | | Material-2 n = 1.5 | | Material-2 n = 1.55 | | Material-2 n = 1.65 | |
|---|---|---|---|---|---|---|---|---|
| 1.7 | 0.831 | (0.204, 0.721) | 0.833 | (0.203, 0.720) | 0.835 | (0.203, 0.720) | 0.837 | (0.202, 0.719) |
| 1.75 | 0.803 | (0.207, 0.718) | 0.809 | (0.207, 0.718) | 0.815 | (0.206, 0.718) | 0.825 | (0.205, 0.718) |
| 1.8 | 0.771 | (0.210, 0.715) | 0.780 | (0.209, 0.715) | 0.791 | (0.209, 0.715) | 0.808 | (0.207, 0.716) |
| 1.9 | 0.732 | (0.206, 0.709) | 0.744 | (0.207, 0.710) | 0.757 | (0.207, 0.710) | 0.778 | (0.208, 0.712) |
| 1.95 | 0.739 | (0.201, 0.710) | 0.749 | (0.202, 0.710) | 0.759 | (0.204, 0.711) | 0.777 | (0.206, 0.712) |

| Material-1 | Material-2 n = 1.7 | | Material-2 n = 1.8 | | Material-2 n = 1.9 | |
|---|---|---|---|---|---|---|
| 1.7 | 0.836 | (0.202, 0.718) | 0.834 | (0.201, 0.717) | 0.829 | (0.201, 0.716) |
| 1.75 | 0.828 | (0.204, 0.718) | 0.832 | (0.203, 0.717) | 0.833 | (0.202, 0.717) |
| 1.8 | 0.815 | (0.207, 0.716) | 0.825 | (0.205, 0.717) | 0.831 | (0.204, 0.717) |
| 1.9 | 0.787 | (0.208, 0.713) | 0.802 | (0.208, 0.714) | 0.812 | (0.208, 0.715) |
| 1.95 | 0.785 | (0.207, 0.712) | 0.796 | (0.208, 0.713) | 0.804 | (0.209, 0.714) |

It may be less practical to reduce the index difference between the two materials, for example where specific materials are desired for the TFB structure. In such cases, the thickness of one material may be reduced to minimize the luminance decrease and color shift due to the interference at the interface. For example, when the thickness of the layer is less than the wavelength of the light, the interface between the two materials is no longer distinct. To find an optimized thickness, simulations were conducted on the effect of the thickness of material-1, using the same device structure as shown in FIG. 3B. The device structure was the same as the one used in Table 3, i.e., HTL/ETL=152 nm/47 nm.

The simulation results are shown in Table 5. When the thickness of material-1 (n=1.95) was 45 nm or less, it was found that the CIE y remained at 0.710 or better. When the thickness is larger than 60 nm, both luminance and CIE y were found to decrease significantly.

TABLE 5

Effect of thickness of material-1.

| Thickness (nm) | Luminance | CIE |
|---|---|---|
| 0 | 0.895 | (0.211, 0.718) |
| 5 | 0.898 | (0.212, 0.719) |
| 10 | 0.894 | (0.213, 0.720) |
| 20 | 0.866 | (0.219, 0.719) |
| 30 | 0.823 | (0.225, 0.717) |
| 45 | 0.755 | (0.233, 0.710) |
| 60 | 0.708 | (0.238, 0.704) |
| 100 | 0.756 | (0.226, 0.699) |
| 250 | 0.705 | (0.235, 0.703) |
| 500 | 0.751 | (0.219, 0.704) |

From Table 2, a preferred structure with HTL/ETL thickness of 152 nm/51 nm was selected for further study, as the structure having the highest output at the desired color. With the index and thickness of the HOL layer set at 1.8 and 80 nm, the corresponding relative luminance and color coordinate are 0.908 and (0.228, 0.711), respectively.

TABLE 6

The optimization of HOL layer index and thickness for best luminance level. The HTL/ETL thickness of the OLED device is 152 nm/51 nm.

| Index | Thickness (nm) | Luminance | CIE |
|---|---|---|---|
| 1.5 | 100 | 0.811 | (0.251, 0.696) |
| 1.6 | 95 | 0.847 | (0.244, 0.701) |
| 1.7 | 90 | 0.880 | (0.236, 0.707) |
| 1.75 | 87 | 0.895 | (0.233, 0.709) |
| 1.8 | 85 | 0.910 | (0.229, 0.712) |
| 1.9 | 80 | 0.937 | (0.223, 0.716) |
| 1.95 | 78 | 0.949 | (0.220, 0.718) |
| 2 | 76 | 0.961 | (0.216, 0.720) |
| 2.1 | 72 | 0.983 | (0.211, 0.725) |
| 2.2 | 69 | 1.002 | (0.205, 0.728) |

In the further simulations, the index of the HOL layer was changed, and the HOL layer thickness was selected to provide the highest luminance level. The simulation results are shown in Table 6. These results indicate that a higher index HOL layer results in a higher luminance level. In fact, for a 69 nm HOL layer with a refractive index of 2.2, the luminance level is better than the rigid glass device without a cover glass. Thus, it was found that a high index HOL layer in conjunction with a low index barrier provides a relatively high luminance and good color. One way to fabricate such a high index HOL layer is to use the organic materials deposited by vacuum thermal evaporation. These materials typically have an index between 1.7 and 1.8. As another example, some nitride and metal oxide materials have indices greater than 1.8, 1.9, or 2.0 and can be used as a HOL layer material. These materials can may provide barrier property as they are dense materials. Examples of such materials include ZnO, IZO, ITO, $ZrO_2$, $TiO_2$ and other similar materials. It is also possible to use combinations of organic materials and metal oxide or nitride materials as the HOL layer.

Table 6 also shows that when the refractive index of the HOL layer is lower than 1.8, the CIE y shifts to lower than 0.71. This shift may be correctable by using a different device structure. For example, with a HOL layer at 90 nm and index of 1.7, HTL/ETL layer thicknesses of 152 nm/49 nm, respectively, may bring the CIE back to (0.227, 0.711), as previously disclosed.

In some cases, it may be desirable to use a structure in which the HOL has an index of 1.7 or more. Accordingly, several cases with $n_1$ of 1.7 or more were studied: 1) $n_1/n_2$=1.7/1.65; 2) $n_1/n_2$=1.95/1.8; and 3) $n_1/n_2$=1.95/1.46, as shown in Table 7. The OLED structure used for the study was HTL/ETL=151 nm/44 nm. The HOL thickness was optimized for various indices of the HOL to obtain the highest luminance level. For all the combinations, CIE y was found to be at least 0.71. It was found that the minimum luminance resulted when the index of the HOL was closest to the lower of $n_1$ and $n_2$ for each case. These results indicate that the larger the difference between the HOL index and the lower value of $n_1$ and $n_2$, the higher the luminance that will be obtained. However, the gain from using a lower index for the HOL is relatively very small compared to the benefit obtained from a higher index, as shown in Table 7. As a result, it may be preferred to have a higher-index HOL to obtain a relatively high luminance level. The method to achieve a high HOL index is the same as previously disclosed herein.

TABLE 7

The optimization of HOL layer index and thickness for best luminance level for $n_1 \geq 1.7$. The HTL/ETL thickness of the OLED device is 151 nm/44 nm.

| | $n_1/n_2$ = 1.7/1.65 | | | $n_1/n_2$ = 1.95/1.8 | | | $n_1/n_2$ = 1.95/1.46 | | |
|---|---|---|---|---|---|---|---|---|---|
| HOL Index | Thickness (nm) | Luminance | CIE | Thickness (nm) | Luminance | CIE | Thickness (nm) | Luminance | CIE |
| 1.5 | 26 | 0.832 | (0.209, 0.718) | 185 | 0.831 | (0.204, 0.720) | 185 | 0.782 | (0.204, 0.720) |
| 1.6 | 29 | 0.828 | (0.209, 0.717) | 173 | 0.829 | (0.203, 0.720) | 173 | 0.784 | (0.203, 0.720) |
| 1.7 | 49 | 0.825 | (0.208, 0.716) | 162 | 0.828 | (0.202, 0.720) | 162 | 0.787 | (0.202, 0.720) |
| 1.8 | 85 | 0.837 | (0.202, 0.719) | 148 | 0.826 | (0.201, 0.719) | 148 | 0.792 | (0.201, 0.719) |
| 1.9 | 85 | 0.852 | (0.196, 0.722) | 125 | 0.828 | (0.200, 0.719) | 125 | 0.801 | (0.200, 0.719) |
| 1.95 | 83 | 0.859 | (0.193, 0.723) | 110 | 0.831 | (0.199, 0.719) | 110 | 0.806 | (0.199, 0.719) |
| 2 | 82 | 0.865 | (0.190, 0.725) | 99 | 0.837 | (0.196, 0.720) | 99 | 0.811 | (0.196, 0.720) |
| 2.1 | 79 | 0.877 | (0.185, 0.728) | 88 | 0.850 | (0.191, 0.722) | 88 | 0.822 | (0.191, 0.722) |
| 2.2 | 76 | 0.886 | (0.179, 0.730) | 82 | 0.862 | (0.186, 0.725) | 82 | 0.833 | (0.186, 0.725) |

Since many materials are used above TFB, it is possible or, in some embodiments, likely that at least one of those layers has a low refractive index (i.e., less than 1.6). Furthermore, it is very likely that if such a layer is included in the device, it is an adhesive layer. As previously noted, the index of the glue layer typically may be in the range of 1.41 to 1.51. Other sources indicate that such layers may have an index in the range of 1.461 to 1.531 (as disclosed, for example, in M. Miyamoto, "Control of Refractive Index of Pressure-Sensitive Adhesives for the Optimization of Multilayered Media", available at http://iopscience.iop.org/article/10.1143/JJAP.46.3978/meta). If the glue has a relatively higher index, then the lowest index material may be a plastic film in the device, which typically has an index less than 1.6.

Throughout the study previously described, the LOL was set to have a refractive index of 1.46. Similar simulations were performed in which the LOL has an index of 1.0, which would be the case when an air. Nitrogen, or similar gap is present above the TFB. Such a gap may be in direct physical contact with the TFB, or there may be one or more intervening layers between the gap and the TFB.

The results of these simulations are shown in Table 8 and Table 9. Tables 8 and 9 correspond to Tables 3 and 4, respectively, with the difference that the index of the LOL was 1.46 in Tales 3 and 4, and 1.0 in Tables 8 and 9.

y coordinate of 0.71 or greater and luminance level within 5.8% of the maximum. When the indices of both materials ($n_1$ and $n_2$) are 1.6 or less ($n_1 \leq 1.6$; $1.35 \leq n_2 \leq 1.6$; $|n_1-n_2| \leq 0.25$), the relative luminance is within 3.5% of maximum for all combinations.

When the index of material-1 is higher than 1.7, and especially when it is higher than 1.75, it may be desirable to keep the indices of both materials relatively close to each other. The maximum luminance is typically achieved when $n_2$. When $|n_1-n_2| \leq 0.25$, the luminance is within 5.8% of maximum for all combinations with the same $n_1$. When $|n_1-n_2| \leq 0.2$, 0.15, or 0.1, the performance is even better.

As previously shown, according to embodiments disclosed herein a device with enhanced optical output may include four primary components: 1) an OLED device including a reflective electrode, organic layers including a light emission layer, and a transparent or semi-transparent electrode; 2) an high index optical layer (HOL) next to the transparent or semi-transparent electrode; 3) a thin film barrier (TFB) next to the HOL layer; and 4) a low index optical layer (LOL) directly or indirectly optically coupled to the TFB layer. In some embodiments, the refractive indices between any two regions in the TFB should be less than 0.25.

The luminance and color of a device as disclosed herein may be adjusted and/or optimized for a desired value by

TABLE 8

Optimization of 2-component TFB structure based on refractive indices: HTL/ETL = 152 nm/47 nm; $n_{LOL} = 1.0$.

| Material-1 | Material-2 n = 1.35 | | Material-2 n = 1.46 | | Material-2 n = 1.5 | | Material-2 n = 1.55 | |
|---|---|---|---|---|---|---|---|---|
| 1.46 | 0.893 | (0.209, 0.716) | 0.895 | (0.211, 0.718) | 0.894 | (0.211, 0.718) | 0.892 | (0.211, 0.719) |
| 1.5  | 0.893 | (0.209, 0.717) | 0.890 | (0.212, 0.717) | 0.887 | (0.212, 0.717) | 0.883 | (0.213, 0.717) |
| 1.6  | 0.898 | (0.213, 0.720) | 0.886 | (0.215, 0.717) | 0.881 | (0.215, 0.716) | 0.874 | (0.216, 0.715) |
| 1.7  | 0.848 | (0.223, 0.717) | 0.852 | (0.222, 0.715) | 0.852 | (0.222, 0.715) | 0.852 | (0.221, 0.714) |
| 1.75 | 0.795 | (0.228, 0.712) | 0.814 | (0.226, 0.712) | 0.819 | (0.225, 0.712) | 0.824 | (0.224, 0.712) |

| Material-1 | Material-2 n = 1.6 | | Material-2 n = 1.7 | | Material-2 n = 1.8 | |
|---|---|---|---|---|---|---|
| 1.46 | 0.890 | (0.212, 0.720) | 0.880 | (0.212, 0.721) | 0.868 | (0.212, 0.722) |
| 1.5  | 0.878 | (0.213, 0.717) | 0.867 | (0.214, 0.718) | 0.853 | (0.215, 0.718) |
| 1.6  | 0.867 | (0.216, 0.715) | 0.852 | (0.217, 0.713) | 0.836 | (0.218, 0.712) |
| 1.7  | 0.851 | (0.221, 0.714) | 0.847 | (0.220, 0.713) | 0.841 | (0.219, 0.712) |
| 1.75 | 0.829 | (0.224, 0.712) | 0.835 | (0.222, 0.712) | 0.838 | (0.221, 0.712) |

TABLE 9

Optimization of 2-component TFB structure based on refractive indices: HTL/ETL = 151 nm/44 nm; $n_{LOL} = 1.0$.

| Material-1 | Material-2 n = 1.46 | | Material-2 n = 1.5 | | Material-2 n = 1.55 | | Material-2 n = 1.65 | |
|---|---|---|---|---|---|---|---|---|
| 1.7  | 0.823 | (0.204, 0.721) | 0.824 | (0.203, 0.720) | 0.825 | (0.203, 0.720) | 0.824 | (0.202, 0.719) |
| 1.75 | 0.786 | (0.207, 0.718) | 0.793 | (0.207, 0.718) | 0.799 | (0.206, 0.718) | 0.808 | (0.205, 0.718) |
| 1.8  | 0.745 | (0.210, 0.715) | 0.756 | (0.209, 0.715) | 0.767 | (0.209, 0.715) | 0.786 | (0.207, 0.716) |
| 1.9  | 0.698 | (0.206, 0.709) | 0.710 | (0.207, 0.710) | 0.724 | (0.207, 0.710) | 0.747 | (0.208, 0.712) |
| 1.95 | 0.706 | (0.201, 0.710) | 0.715 | (0.202, 0.710) | 0.726 | (0.204, 0.711) | 0.746 | (0.206, 0.712) |

| Material-1 | Material-2 n = 1.7 | | Material-2 n = 1.8 | | Material-2 n = 1.9 | |
|---|---|---|---|---|---|---|
| 1.7  | 0.822 | (0.202, 0.718) | 0.818 | (0.201, 0.717) | 0.811 | (0.201, 0.716) |
| 1.75 | 0.812 | (0.204, 0.718) | 0.816 | (0.203, 0.717) | 0.817 | (0.202, 0.717) |
| 1.8  | 0.794 | (0.207, 0.716) | 0.805 | (0.205, 0.717) | 0.814 | (0.204, 0.717) |
| 1.9  | 0.757 | (0.208, 0.713) | 0.775 | (0.208, 0.714) | 0.789 | (0.208, 0.715) |
| 1.95 | 0.754 | (0.207, 0.712) | 0.767 | (0.208, 0.713) | 0.776 | (0.209, 0.714) |

The results show similar trends between the configurations in which the LOL had an index of 1.0 and 1.46. When the index of material-1 $n_1$ is 1.7 or less, all the combinations in the table ($n_1 \leq 1.7$; $1.35 \leq n_2 \leq 1.7$; $|n_1-n_2| \leq 0.35$) have a CIE selecting materials with specific refractive indices or combinations of indices, and/or by selecting thicknesses of the various layers. For example, in an embodiment, a multilayer TFB may be used in which the difference in refractive indices between two layers in the TFB is not greater than 0.2, not greater than 0.15, or not greater than 0.1. As another example, the overall refractive index of the TFB may be not more than 1.6 or less, i.e., each material in the TFB may have a refractive index of not more than 1.6, not more than 1.5, or not more than 1.46.

In some embodiments, specific relationships between the various layers may be used. For example, the refractive index of the HOL may be at least about equal to the lowest index among organic layers between the electrodes in the OLED. Alternatively or in addition, the index of the HOL may be 1.7 or greater, 1.8 or greater, or more. In some embodiments, the HOL may be made from materials including nitrides, metal oxides, or combinations thereof.

In some embodiments, the LOL may have specific dimensions and/or a limited refractive index. For example, the LOL may have a thickness of at least a quarter of the wavelength of light produced by the OLED. The index may be less than 1.6, such as when plastic films or adhesive layers are used, less than 1.53, less than 1.51, or less.

As used herein, a "high index" optical layer generally refers to a layer having an index of refraction of at least 1.7, unless indicated otherwise. Similarly, a "low index" optical layer refers to a layer having an index of refraction of not more than 1.6 unless indicated otherwise.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a substrate;
   an OLED disposed over the substrate and comprising a first emissive layer configured to emit light of a first color;
   a high index optical layer having a refractive index of not less than 1.7 disposed over the OLED;
   a thin film barrier disposed over the high index optical layer; and
   a low index optical layer having a refractive index of not more than 1.6 disposed over the thin film barrier.

2. The device of claim 1, wherein the low index optical layer comprises an optically clear adhesive layer.

3. The device of claim 2, wherein the optically clear adhesive layer comprises a pressure sensitive adhesive.

4. The device of claim 1, wherein the thin film barrier comprises a plurality of layers.

5. The device of claim 4, wherein the thin film barrier comprises:
   a first layer comprising a first material having a first refractive index n1; and
   a second layer comprising a second material having a second refractive index n2;
   wherein $|n1-n2| \leq 0.2$.

6. The device of claim 5, wherein $|n1-n2| \leq 0.15$.

7. The device of claim 5, wherein $|n1-n2| \leq 0.1$.

8. The device of claim 4, wherein the refractive index between any two regions of the thin film barrier is not more than 0.25.

9. The device of claim 1, wherein the thin film barrier has a refractive index of not more than 1.5.

10. The device of claim 9, wherein the thin film barrier has a refractive index of not more than 1.46.

11. The device of claim 1, wherein the high index optical layer has a refractive index of not less than 1.8.

12. The device of claim 1, wherein the low index optical layer has a thickness of about one quarter of a wavelength of the first color, according to the 1931 CIE chart.

13. The device of claim 1, wherein the low index optical layer has a refractive index of not more than 1.53.

14. The device of claim 1 further comprising a touch sensor disposed above the thin film barrier and below the low index optical layer.

15. The device of claim 1 further comprising a polarizer disposed above the thin film barrier and below the low index optical layer.

* * * * *